United States Patent [19]

Bakos et al.

[11] 4,276,186

[45] Jun. 30, 1981

[54] CLEANING COMPOSITION AND USE THEREOF

[75] Inventors: Peter Bakos, Endicott; Gerald A. Bendz, Vestal; Russell E. Darrow, Newark Valley; Dennis L. Rivenburgh, Endicott, all of N.Y.

[73] Assignee: International Business Machines Corporation, Armonk, N.Y.

[21] Appl. No.: 52,160

[22] Filed: Jun. 26, 1979

[51] Int. Cl.³ .............................................. C11D 7/32
[52] U.S. Cl. .................................. 252/158; 252/156; 252/170; 252/171; 252/79.5; 252/364; 252/DIG. 8; 134/38; 134/40; 427/82; 427/88; 427/96; 427/299; 427/300
[58] Field of Search ............... 252/156, 158, 170, 171, 252/79.5, 364, DIG. 8; 134/38, 40; 156/17; 427/82, 88, 96, 299, 300

[56] References Cited

U.S. PATENT DOCUMENTS

| | | | |
|---|---|---|---|
| 3,673,099 | 6/1972 | Corhy et al. | 134/38 X |
| 3,706,691 | 12/1972 | Duffy et al. | 136/38 X |
| 3,813,309 | 5/1974 | Bakos et al. | 134/38 X |
| 3,871,930 | 3/1975 | Fish | 252/79.5 X |
| 3,876,461 | 4/1976 | Flowers | 427/82 |
| 4,078,102 | 3/1978 | Bendz et al. | 252/79.5 X |

*Primary Examiner*—Mayer Weinblatt
*Attorney, Agent, or Firm*—Pollock, Vande Sande & Priddy

[57] ABSTRACT

A cleaning composition which includes N-methyl-2-pyrrolidone and an alkanolamine, and use thereof for cleaning substrates.

21 Claims, No Drawings

CLEANING COMPOSITION AND USE THEREOF

DESCRIPTION

1. Technical Field

The present invention is concerned with providing a cleaning composition which is especially suitable for removing solder flux and solder flux residue from a substrate, particularly during the manufacture of integrated circuit modules. In addition, the present invention is concerned with cleaning compositions suitable for removing various cured synthetic organic polymer compositions from a substrate and especially for removing the top seal of an integrated circuit chip module, such as a cured polyimide coating composition. Moreover, the present invention is directed to the process of employing the cleaning composition.

2. Background Art

During the preparation of integrated circuit modules, input/output (I/O) pins are inserted into the substrate. The input/output pins provide the needed electrical connections to the integrated circuit chip or chips which are subsequently connected to the substrate or carrier. When the module is to be connected to a printed circuit board by a soldering process, solder flux compositions have been applied to the pins. Flux compositions are employed to remove oxides from the pins and to prevent the pins from oxidizing when subjected to elevated temperatures for soldering and thereby serving to maintain the electrical conductivity of the pins. Once the solder is applied, any flux composition or residue therefrom (e.g.—polymerized species) remaining on the pins and substrate must be removed to provide as clean a substrate as possible. However, the obtaining of a suitable composition to remove the flux or residue therefrom is quite a problem. In particular, the composition must act as a selective solvent or dispersant for the flux and/or flux residue but at the same time must not adversely affect (e.g.—etch) the substrate, pins, and other materials present on the substrate. For instance, the substrate can include, at preselected areas, certain metals, such as copper and/or chrome, which if removed by the cleaning composition would destroy the necessary metallurgical pattern on the substrate and could render the integrated circuit module unsuitable for its intended purpose.

Integrated circuit chips are attached to the integrated cuircuit substrate or carrier by applying solder to preselected areas on the substrate which is generally referred to in the art as the chip pad area. Such areas can be defined, for instance, by providing pre-selected exposed areas of a metal which will accept the solder such as copper. In addition, the flux composition would normally be applied to the substrate to facilitate the application of solder to the chip pad area. After solder is applied to the chip pad area, any flux and/or flux residue must be removed prior to attaching the integrated circuit chip so as to provide as clean a module as possible.

Therefore, an object of the present invention is to provide a composition capable of removing flux and/or residue therefrom without adversely affecting the rest of the module.

A top seal coating can be applied to the integrated circuit module after attachment of the integrated circuit chip(s) in order to protect the backside of such which contains the integrated circuit chip(s) from corrosion and/or electromigration. When there are multiple integrated circuit chips on a substrate and/or when multiple substrates are interconnected such as by stacking and whereby the top seal acts to maintain the multiple substrates in interconnection, the mal-function of one chip would require discarding the entire integrated circuit package unless the top seal could be removed without destroying the rest of the module.

Accordingly, an object of the present invention is to provide a composition capable of removing the top seal without adversely affecting the rest of the module and thereby making it possible to remove any defective chip which may be present and then have it replaced, thereby making it possible to save the remainder of the integrated circuit module and reusing the same.

One type of top seal employed is from curing a composition containing as the binder a polyimide polymer. The polyimides are actually cured polymers from what are referred to as polyamides or polyamide-acids containing imide groupings along the polymer chain by condensation of the amide form with an acid group of the polymer chain. Such polymers as is well known in the art are prepared by reacting at least one diamine with at least one polycarboxylic acid and/or anhydride thereof and/or ester. Accordingly, an object of the present invention is to provide a cleaning composition capable of removing a cured polyimide composition from a substrate.

N-methyl-2-pyrrolidone is a well-known solvent and cleaning agent. In fact, such has been employed in combination with other constituents as a stripping or depotting composition. For instance, U.S. Pat. No. 3,673,099 to Corby et al suggests compositions containing N-methyl-2-pyrrolidone in combination with a strong base, such as an alkali hydroxide and use thereof to strip certain cured resins, such as silicones and polyvinyl cinnamate, from substrates. In addition, U.S. Pat. No. 3,876,461 to Flowers suggests immersing plastic encapsulated semiconductor devices in N-methyl-2-pyrrolidone. U.S. Pat. No. 3,706,691 to Duffy suggests dissolving certain encapsulating compositions such as polyamides, polyesters, and certain polyurethanes which have been deteriorated due to exposure to a hot moist atmosphere by employing a composition which contains benzyltrimethylammonium hydroxide in combination with N-methyl-2-pyrrolidone. However, none of the above patents suggest the compositions required by the present invention which contain N-methyl-2-pyrrolidone nor suggest that such compositions are capable of removing flux and/or flux residue and when properly modified are capable of removing cured top seal polymers such as cured polyimides.

U.S. Pat. No. 3,331,718 to Ruffing suggests the removal of polyamide/imide films with strong caustic but does not suggest the use of compositions containing the required ingredients as will be discussed hereinbelow.

U.S. Pat. No. 3,551,204 to Bolger et al suggests compositions for dissolving polyurethane and epoxy resin systems which contain about 0.1 to 3.0 parts by weight of water, about 3 to 7 parts by weight of alkali metal hydroxide and about 90 to 96.9 parts by weight of certain monohydric alcohols or certain ethylene glycol monoalkyl ethers. This patent further suggests the addition of very small quantities (e.g.—up to about 5 or 10%) of other solvents including methyl pyrrolidone (see column 3, lines 10–18).

DISCLOSURE OF INVENTION

The present invention is concerned with a cleaning composition which contains at least about 50% by weight of N-methyl-2-pryyolidone and at least about 10% by weight of a water miscible alkanolamine. In addition, the present invention is concerned with a cleaning composition which contains the above defined ingredients along with about 0.1 to about 10% by weight of an alkali metal and/or alkaline earth metal base. The present invention is also concerned with cleaning a substrate by contacting the substrate with a composition of the type defined hereinabove.

BEST MODES FOR CARRYING OUT THE INVENTION

The compositions of the present invention contain N-methyl-2-pyrrolidone and a water miscible alkanolamine. Such compositions are especially suitable for removing solder flux and the residue therefrom from a substrate such as input/output pins and a ceramic integrated circuit chip carrier both prior to and after attachment of the integrated circuit chips.

The alkanolamines employed according to the present invention are preferably water soluble and must be miscible with the N-methyl-2-pyrrolidone. In addition, such amines should be relatively high boiling materials such as boiling above about 100° C. and have high flash points such as above about 150° F. The alkanolamines can be primary, secondary, or tertiary amines and are preferably monoamines, or diamines, or triamines, and most preferably monoamines. The alkanol group of the amine is preferably an unsubstituted monoalkanol and preferably contains from one to four carbon atoms. Examples of some suitable alkanolamines include monoethanolamine, diethanolamine, triethanolamine, isopropanolamine, 2-amino-1-propanol, 3-amino-1-propanol, and isobutanolamine. The preferred alkanolamines employed according to the present invention are monoethanolamine, diethanolamine, and triethanolamine. Mixtures of alkanolamines can be employed when desired.

The presence of the alkanolamine enhances the solvent action of the composition. Although methyl pyrrolidone, especially at elevated temperatures, can remove certain flux stains due to polymerization of the flux upon exposure to the elevated temperatures experienced during soldering, the removal process is at a slow rate and requires a considerable amount of time. The presence of the alkanolamine significantly reduces the time needed to effect removal. Also, the use of the alkanolamine makes it possible to remove stains or residue from solder flux which is not removable to any significant extent by methyl pyrrolidone alone. Moreover, it is believed tha the alkanolamines employed act as a wetting agent to facilitate washing of the cleaning composition from the substrate after contact with the substrate.

The cleaning compositions of the present invention contain at least about 50% by weight of the N-methyl-2-pyrrolidone, preferably at least about 75% by weight, and most preferably at least about 90% by weight of the N-methyl-2-pyrrolidone. In addition, the compositions of the present invention contain at least about 5% by weight of the alkanolamine and preferably at least about 10% by weight of the alkanolamine.

The above relative amounts are based upon the total of N-methyl-2-pyrrolidone and alkanolamine present in the composition. Moreover, the compositions of the present invention should be substantially (e.g.—less than about 5% by weight), if not completely, free from water. For instance, the presence of more than about 5% by weight of water prevents significant removal of flux and/or flux residue.

It is also possible to include other solvents in the composition provided such are not present in such amounts which would adversely affect the compositions to an undesirable extent. For instance, up to about 35% of such hydrocarbon solvents as the aromatic hydrocarbons, including toluene and xylene, and cycloaliphatics, such as cyclohexane; ketones, such as cyclohexanone, and chlorinated and/or fluorinated hydrocarbons such as perchloroethylene and the Freons, such as tetrafluoroethane can be used.

The compositions of the present invention can also include minor amounts (e.g.—up to about 5% by weight) of surface active agents including cationic, anionic and amphoteric surfactants. An example of a suitable surfactant is sodium lauryl sulfate.

The substrates which are treated according to the present invention include those substrates commonly used in the preparation of integrated circuit modules or carriers such as ceramic substrates. A ceramic is a product or material manufactured by the action of heat on earthly raw materials. Preferred ceramic substrates include aluminum oxides, silicon oxides and silicates, such as aluminum silicate. The solder flux or residue therefrom which can be treated with the above defined cleaning compositions include those flux compositions which are particularly suitable in the preparation of integrated circuit modules and include those compositions wherein the principal or primary flux material includes abietic acid, mixtures which contain major amounts of abietic acid, such as rosin, shellac, the polyalkylene glycols, the polyoxyalkylene ethers, or mixtures thereof.

The alkylene moieties of the glycols and ethers include ethylene, propylene, and butylene or mixtures thereof, and most preferably ethylene. Such glycols and ethers generally have molecular weights from about 200 to about 6000. Some commercially available polyalkylene glycols and polyoxyalkylene ethers include Carbowax 300—monostearate form [HO(CH$_2$CH$_2$O)$_5$CH$_2$CH$_2$OOC(CH$_2$)$_{16}$CH$_3$]; Carbowax 400—monolaurate form [HO(CH$_2$CH$_2$O)$_8$CH$_2$CH$_2$OOC (CH$_2$)$_{10}$CH$_3$]; and Carbowax 400—monooleate form (C$_{36}$H$_{70}$O$_{11}$). An example of a polyoxyalkylene ether is one commercially available from Dow Chemical Company under the designation P-15-200. P-15-200 according to the manufacturer is a polyoxyalkylene ether containing methyl side chains and terminal hydroxyl groups. The figure "200" following the "15" designates the viscosity of the material in centistokes at 100° F.

Mixtures of principal flux materials can be present in any solder flux compositions. Moreover, the solder flux compositions may include other ingredients which are present, such as plasticizers and auxiliary bonding agents.

The above compositions of the present invention are also capable of removing organic polymeric solder mask compositions from the treated substrates. Such compositions can be obtained from mixtures containing a film-forming polymer such as a liquid polyepoxide or a polyimide/amide; a detackifier; and a solid high temperature resistant filler. Preferred solder mask compositions of this type are disclosed in U.S. Pat. Application Ser. No. 045,524, filed June 4, 1979, entitled "Screenable and Strippable Solder Mask and Use Thereof" to Bakos et al, the disclosure of which is incorporated herein by reference.

The preferred polyimide/amides in said solder mask compositions have molecular weights from about 500 to about 2500, and the liquid epoxides are preferably polyepoxides of epichlorohydrin and bisphenol A. In addition, the detackifying component of such compositions includes liquid silicone oils, terpenes, terpineols, drying oils and mixtures of such. When the film-forming polymer is a liquid polyepoxide, the detackifier includes a silicone oil.

The above compositions once heated but without the filler would not be removable from the substrate by use of compositions containing only N-methyl-2-pyrrolidone and alkanolamine. The filler employed in such compositions generally has a particle size of about 0.1 to about 20 microns, and preferably about 0.1 to about 5 microns. Such filler must be capable of withstanding the elevated temperatures from exposure to hot solder and should withstand temperatures of at least about 300° C., and preferably at least about 350° C. The solder is generally applied at temperatures between about 300° and about 400° C. Examples of some suitable solid high-temperature resistant fillers include ground glass, zinc oxide, silicon dioxide, alumina, diamond dust, and the high-temperature resistant sands.

The ratio of the film-forming polymer of the polymer portion of the composition relative to the detackifier in such compositions is generally about 2:1 to about 1:3, and preferably about 1:1 to about 2:3. The amount of filler employed relative to the film-forming polymer component of the polymer portion of the composition is about 1:3 to about 6:1, and preferably about 2:1 to about 6:1.

Substrates to be treated with one of the above compositions are generally contacted with one of the above compositions while the composition is at a temperature of about 35° to about 100° C., preferably about 50° to about 90° C., and most preferably about 60° to about 85° C. The contact is most readily achieved by dipping the substrates into a vessel which contains the composition. The contact time is generally from about 10 seconds to about 30 minutes. The temperature of the composition and contact time are inversely related. That is the higher the temperature, the shorter the contact time needed to assure removal. A contact time of about 2 minutes for a composition of about 90% by weight N-methyl-2-pyrrolidone and about 10% by weight to triethanolamine at a temperature of about 65° C.±5° C. is especially suitable for a commercial operation. It has been observed that the above specific composition failed to remove flux residue at temperatures below 35° C. and between 35° and about 40° C. required about 23 minutes to contact time for removal.

The contact can be carried out with some agitation of the composition, such as by stirring or shaking to facilitate contact of the composition with difficult to reach portions of the substrate. Also, the composition can be recirculated to a heat exchanger in order to maintain and control the temperature of the composition.

The substrate, after contact with the composition and removal therefrom, can be rinsed with water to wash off any remaining cleaning composition therefrom. It is believed that the amines which were present in the cleaning composition act as a detergent during this stage of the process. In addition, it may be desirable to employ a drying step such as by blowing air across the substrate.

In order to remove cured top seal compositions, such as cured polyimide compositions, from a substrate, it is necessary to modify the above defined cleaning compositions by incorporating therein an alkali metal base and/or alkaline earth metal base. Suitable alkali metal and/or alkaline earth metal base materials include the basic compounds of the alkali and alkaline earth metals, such as the hydroxides, oxides, and alcoholates. Examples of some suitable metals include lithium, sodium, potassium, calcium and magnesium. Examples of some specific basic compounds are lithium hydroxide, sodium hydroxide, potassium hydroxide, and calcium hydroxide. Mixtures of the basic materials can be employed when desired. The base should be miscible with the methyl pyrrolidone and alkanolamine combination. Generally, the alkali meal base and/or alkaline earth metal base is employed in amounts from about 0.1 to about 10% by weight of the total of the methyl pyrrolidone, alkanolamine and alkali metal base and/or alkaline earth metal base in the composition. The compositions which contain such basic materials generally have a pH of above about 10 as tested with litmus paper.

It is quite surprising that the compositions of the present invention remove cured polyimide without damaging the matallurgy on the substrate, such as chrome lines, since chrome is considered soluble in alkaline and generally alkaline compositions with pH of 10 or more etch chrome. However, according to the present invention, the compositions do not etch chrome even when exposed to the compositions for 24 hours at about 100° C. The modified compositions in addition to removing the cured top seal coatings will also remove the substances which are removed by the compositions of the present invention which contain only N-methyl-2-pyrrolidone and the alkanolamine.

These modified compositions are also capable of removing exposed organic photoresist compositions such as those obtained from polyvinylcinnamate, polyvinylacrylate, and polyalkylacrylates, and polyalkylmethacrylates, such as polymethylmethacrylate (e.g.—Reston from Du Pont). The modified compositions are also capable of removing dried coatings from compositions employing such binders as the polyalkylacrylates and polyalkylmethacrylates; and drying oils, such as the natural drying oils including linseed oil, tung oil and the like.

In the compositions of the present invention which contain the alkali metal and/or alkaline earth metal base materials, the alkanolamine also acts as a stabilizing agent to prevent the alkali metal and/or alkaline earth metal base from precipitating out.

The compositions containing the alkali metal and/or alkaline earth metal base material are preferably prepared by dissolving such into the alkanolamine by use of elevated temperatures such as about 125° to about 170° C. Next the composition of the alkanolamine and alkali metal and/or alkaline earth metal base is admixed with the methyl pyrrolidone. This sequence tends to stabilize the composition and to prevent precipitation of the alkali metal and/or alkaline earth metal base material.

Typical polyimide top seal compositions contain an aromatic polyimide resin such as AI-10 from AMOCO which is from pyromellitic dianhydride and 4,4'-diaminodiphenol ether, and a minor amount (e.g.—about 1 to 2% by weight) of a silane such as beta-(3,4-epoxycyclohexyl)-ethyltrimethoxysilane, gamma-aminopropyltriethoxysilane, N-bis(beta-hydroxyethyl)-gamma-aminopropyltriethoxysilane, N-beta(aminoethyl)-gamma-aminopropyl-trimethoxysilane and gamma-glycidoxypropyltrimethoxysilane.

Some examples of aromatic polyimides can be found in U.S. Pat. No. 3,331,718 and U.S. Patent Application Ser. No. 045,524, referred to hereinabove.

The top seal polyimide compositions do not contain a solid high temperature resistant filler in such amounts as employed in the above described solder mask compositions which would render the top seal removable from the substrate with only the N-methyl-2-pyrrolidone and alkanolamine combination.

The modified compositions which contain the alkali metal and/or alkaline earth metal basic material when employed to remove a cured top seal, such as cured polyimides, are generally employed at elevated temperatures, such as about 100° to about 200° C., and preferably at about 115° to about 150° C. The time of contact to remove the compositions will depend upon the thickness of the coating to be removed. For instance, a coating of about 7.6 to about 25.4 microns thickness generally requires about 5 to about 10 minutes removal at the above temperatures; whereas, a coating of about 80 to about 150 microns thickness generally requires about ½ to about 3 hours, and preferably about 1 to about 1½ hours of contact. After contact with the solvent composition, the substrates can be washed with water and then dried by blowing with hot or cold air.

When the above compositions are employed to remove the top seal which in turn is desirable in order that a defective chip can be removed from the substrate, the substrate is then exposed to high enough temperatures to melt the solder which bonds the chips to the substrate. Then the chips can be removed and replaced.

Although the above discussion is mainly concerned with the treatment of integrated circuit modules, it is understood that the present invention is applicable to treating substrates in general which necessitate the removal of the above discussed types of materials from the substrates.

The following non-limiting examples are provided to further illustrate the present invention.

EXAMPLE I

About 920 ml of N-methyl-2-pyrrolidone and about 80 ml of triethanolamine are admixed to provide a cleaning composition. Into a vessel containing the composition at about 85° C. are dipped ceramic integrated circuit modules having flux stains and residue thereof on and in the substrate. The ceramic substrate is an aluminum dioxide substrate having thereon chrome and copper metallurgy and containing gold coated input-/output pins. The flux stains or flux residue stains are from a flux composition which contained rosin and isopropylalcohol as a solvent.

The substrates are dipped into the cleaning composition for about 2 minutes. Next the substrates are contacted with N-methyl-2-pyrrolidone for about ½ minute to rinse off the solvent and are rinsed in water for about ½ minute and then dried by blowing air across the modules.

The composition of the present invention removed all of the flux or flux residue from the substrate and pins. Modules which were exposed too long to the high temperature of the soldering process due to jamming of the solder machine contained some carbonized residue which could not be removed by the above composition nor any other known composition.

The copper and chrome metallurgy and the other parts of the substrate were not attacked by the removal composition.

EXAMPLE II

About 49.25 grams of triethanolamine is heated to about 130° C., and about 0.15 grams of sodium hydroxide are added while the hot triethanolamine is stirred. The sodium hydroxide added is in a powder form and requires about one hour to go into solution. If pellets of sodium hydroxide are employed, about 2 to about 3 hours are required to dissolve it into the triethanolamine.

After a clear transparent solution of the sodium hydroxide and the triethanolamine is obtained, about 50 grams of N-methyl-2-pyrrolidone are added to the composition. Next, the temperature is raised to about 130°±5° C. Substrates of the type employed in Example I which also contained an integrated circuit chip soldered to the substrate, and a top seal of a cured polyimide containing composition obtained is dipped into the heated solvent solution with stirring of the solution. The contact is employed for about 12 minutes after which the substrate is rinsed with water.

The cured top seal is removed completely from the substrate and without adversely affecting any other parts of the module and/or chip.

EXAMPLE III

Example I is repeated except that the composition employed contained about 19.2 grams of triethanolamine, about 0.8 grams of sodium hydroxide, about 50 grams of N-methyl-2-pyrrolidone, and about 30 grams of cyclohexane. The composition is heated to about 90°±5° C. for the contact with the substrate. The above composition also removes various paint compositions, such as polyalkylacrylates, and drying oil paint compositions, and photoresists, such as polyvinylcinnamate. It completely very rapidly removed the flux stains.

EXAMPLE IV

Example I is repeated except that the composition contains about 1 gram of sodium hydroxide; about 23 grams of triethanolamine; about 50 grams of N-methyl-2-pyrrolidone; and about 31 grams of tetrafluoroethane. The composition is at about 125° C. during contact with the substrate.

The results obtained are similar to those of Example 3.

Having thus described our invention, what we claim as new, and desire to secure by Letters Patent is:

1. A cleaning composition capable of removing at least a flux or flux residue from a ceramic substrate selected from the group consisting of aluminum oxides, silicon oxides, and aluminum silicate which consists essentially of at least about 50% by weight of N-methyl-2-pyrrolidone and at least about 5% by weight of a water miscible alkanolamine, and 0 to about 35% by weight of a solvent selected from the group consisting of hydrocarbon solvents, chlorinated hydrocarbons, fluorinated hydrocarbons, and mixtures thereof, and wherein the alkanolamine is miscible with said N-methyl-2-pyrrolidone and is a monoamine, wherein the alkanol group contains 1-4 carbon atoms.

2. The composition of claim 1 wherein the N-methyl-2-pyrrolidone is present in an amount of at least about 75% by weight.

3. The cleaning composition of claim 1 wherein the N-methyl-2-pyrrolidone is present in a composition in an amount of at least about 90% by weight.

4. The cleaning composition of claim 1 wherein the alkanolamine is present in an amount of at least 10% by weight.

5. The composition of claim 1 which contains less than about 5% by weight of water.

6. A method for cleaning a ceramic substrate selected from the group consisting of aluminum oxides, silicon oxides, and aluminum silicate, which comprises contacting said substrate with the composition of claim 1.

7. The method of claim 6 wherein said substrate contains thereon a flux or flux residue wherein said flux or flux residue is obtained from flux composition which contains a material selected from the group of abietic acid, rosin, shellac, polyalkyleneglycol, polyoxyalkyleneglycol, or mixture thereof.

8. The cleaning composition of claim 1 which further contains about 0.1 to about 10% by weight of a basic compound of an alkali metal, or a basic compound of an alkaline earth metal, or mixture thereof; wherein said basic compound is selected from the group consisting of hydroxide, oxide and mixtures thereof.

9. The composition of claim 8 wherein said basic compound is selected from the group consisting of lithium hydroxide, sodium hydroxide, potassium hydroxide, calcium hydroxide, or mixtures thereof.

10. The method for preparing the cleaning composition of claim 8 which comprises dissolving said basic compound metal, alkaline earth metal base, or mixture thereof into said alkanolamine by heating said alkanolamine to a temperature of about 125° to about 170° C.; and then admixing the thus obtained composition with N-methyl-2-pyrrolidone.

11. The composition of claim 8 wherein the pH is above about 10.

12. A method for cleaning a ceramic substrate selected from the group consisting of aluminum oxide, silicon oxide, and aluminum silicate which contains a cured polyimide composition thereof which comprises contacting said substrate with a composition of claim 8.

13. The method of claim 12 wherein said substrate is an integrated circuit module containing a cured polyimide top seal coating thereon.

14. The method of claim 12 wherein said contact is carried out at a temperature of about 100° to about 200° C.

15. The method of claim 6 wherein said composition is at a temperature of about 35° to about 100° C.

16. The method of claim 6 wherein said composition is at a temperature of about 50° to about 90° C.

17. The method of claim 6 wherein said composition is at a temperature of about 60° to about 85° C.

18. The method of claim 6 wherein said substrate contains copper, or chrome, or both thereon.

19. The method of claim 6 wherein said substrate is a ceramic substrate containing at least one integrated circuit chip soldered thereon.

20. The method of claim 6 wherein said contact is for about 10 seconds to about 30 minutes.

21. The method of claim 20 wherein said contact is carried out at a temperature of about 115° to about 150° C.

* * * * *

UNITED STATES PATENT AND TRADEMARK OFFICE
CERTIFICATE OF CORRECTION

PATENT NO. : 4,276,186
DATED : June 30, 1981
INVENTOR(S) : Bakos et al

It is certified that error appears in the above—identified patent and that said Letters Patent is hereby corrected as shown below:

On The Title Page:
In [56] References Cited U.S. PATENT DOCUMENTS,
the first listed reference should be to
--Corby et al-- rather than "Corhy et al".

Column 3, line 5, change "pryyolidone" to --pyrrolidone--; and
line 55, change "tha" to --that--.
Column 5, line 56, delete "to" and insert therefor --of--.
Column 6, line 18, change "meal" to --metal--; and
line 27, change "matallurgy" to --metallurgy--.

Signed and Sealed this

Tenth Day of November 1981

[SEAL]

Attest:

GERALD J. MOSSINGHOFF

*Attesting Officer*     *Commissioner of Patents and Trademarks*